(12) United States Patent
Wang et al.

(10) Patent No.: US 11,962,307 B2
(45) Date of Patent: Apr. 16, 2024

(54) OUTPUT CIRCUIT HAVING MULTI-LEVEL OUTPUT AND COMPARATOR CIRCUIT THEROF

(71) Applicant: SigmaStar Technology Ltd., Fujian (CN)

(72) Inventors: Hao Wang, Shanghai (CN); Zhen-Yang Pang, Shanghai (CN)

(73) Assignee: SIGMASTAR TECHNOLOGY LTD., Fujian (CN)

( * ) Notice: Subject to any disclaimer, the term of this patent is extended or adjusted under 35 U.S.C. 154(b) by 0 days.

(21) Appl. No.: 18/087,971

(22) Filed: Dec. 23, 2022

(65) Prior Publication Data
US 2023/0238951 A1    Jul. 27, 2023

(30) Foreign Application Priority Data
Jan. 26, 2022 (CN) .......................... 202210094594.1

(51) Int. Cl.
*H03K 5/24* (2006.01)
*H03K 17/56* (2006.01)
*H03K 19/0175* (2006.01)

(52) U.S. Cl.
CPC ............... *H03K 5/24* (2013.01); *H03K 17/56* (2013.01); *H03K 19/017509* (2013.01)

(58) Field of Classification Search
CPC ...... H03K 17/10; H03K 17/102; H03K 17/12; H03K 17/122; H03K 17/16; H03K 17/161; H03K 17/30; H03K 17/302; H03K 19/003; H03K 19/00307; H03K 19/00315; H03K 19/00346; H03K 19/00353; H03K 19/00361; H04L 25/026
USPC ............................................ 327/77, 108–112
See application file for complete search history.

(56) References Cited

U.S. PATENT DOCUMENTS

| | | | | |
|---|---|---|---|---|
| 4,812,672 A | * | 3/1989 | Cowan | H02J 9/061 307/64 |
| 7,362,161 B2 | * | 4/2008 | Sone | H02J 7/34 327/407 |
| 2010/0271118 A1 | * | 10/2010 | Bhattacharya | H03K 19/018528 327/543 |
| 2019/0149149 A1 | * | 5/2019 | Pan | H03K 17/687 327/109 |
| 2021/0409020 A1 | * | 12/2021 | Singrigowda | H01L 27/0922 |
| 2022/0158446 A1 | * | 5/2022 | Lai | H01L 27/0266 |

* cited by examiner

*Primary Examiner* — Quan Tra
(74) *Attorney, Agent, or Firm* — Edell, Shapiro & Finnan, LLC

(57) ABSTRACT

An output circuit includes a comparator circuit, a voltage conversion circuit and a signal output circuit. The comparator circuit detects an operating mode based on a first supply voltage and a second supply voltage and generates a first control signal. The voltage conversion circuit adjusts a level of an output voltage from a low-dropout regulator according to the first control signal to generate a first voltage, and generates a second voltage according to the first control signal and the first voltage. The signal output circuit adjusts a level of a digital signal according to the first voltage, the second voltage and the first supply voltage to generate a digital output signal corresponding to the operating mode.

15 Claims, 6 Drawing Sheets

OUTPUT CIRCUIT HAVING MULTI-LEVEL OUTPUT AND COMPARATOR CIRCUIT THEROF

This application claims the benefit of China application Serial No. CN202210094594.1, filed Jan. 26, 2022, the subject matter of which is incorporated herein by reference.

BACKGROUND OF THE INVENTION

Field of the Invention

The present application relates to an output circuit, and more particularly to an output circuit capable of generating an output at different levels and a comparator circuit detecting an operating mode thereof.

Description of the Related Art

In some transmission interfaces, supply voltages at different levels need to be produced to generate levels of corresponding signals under different operating modes, so as to exchange signals with different devices or circuits. In the prior art, an operating mode of a circuit in a transmission interface is configured by means of an input command, rather than automatically switching the operating mode according to supply voltages at different levels. Moreover, to ensure reliability and operation stability, strict restrictions are specified for control signals used for configuring an operating mode and a switching order of multiple supply voltages.

SUMMARY OF THE INVENTION

In some embodiments, it is an object of the present application to provide an output circuit having a multi-level output and a comparator circuit that detects an operating mode thereof based on a supply voltage so as to improve the issues of the prior art.

In some embodiments, an output circuit includes a comparator circuit, a voltage conversion circuit and a signal output circuit. The comparator circuit detects an operating mode based on a first supply voltage and a second supply voltage and generates a first control signal. The voltage conversion circuit adjusts a level of an output voltage from a low-dropout regulator according to the first control signal to generate a first voltage, and generates a second voltage according to the first control signal and the first voltage. The signal output circuit adjusts a level of a digital signal according to the first voltage, the second voltage and the first supply voltage to generate a digital output signal corresponding to the operating mode.

In some embodiments, the comparator circuit is used to detect an operating mode according to a first supply voltage and a second supply voltage, and the comparator circuits includes a first transistor, a pull-down resistor, a comparator, a filter circuit and a second transistor. The second transistor receives the second supply voltage through the filter circuit, and is selectively turned on according to a level of a control node so as to transmit the second supply voltage to the first node. The comparator compares a level of the first node with a predetermined voltage to generate the first signal, wherein the predetermined voltage is generated by dividing the first supply voltage. The first transistor is selectively turned on according to the first signal so as to output the first supply voltage as a first control signal. The pull-down resistor is coupled between the first transistor and the ground.

In some embodiments, an output circuit includes a voltage conversion circuit, a level adjustment circuit and multiple control circuits. The voltage conversion circuit adjusts a level of an output voltage from a low-dropout regulator according to a first control signal to generate a first voltage, and generates a second voltage according to the first control signal and the first voltage. The level adjustment circuit adjusts a level of a digital signal according to the first voltage, the second voltage, a first bias voltage, a second bias voltage and the first supply voltage so as to generate a digital output signal corresponding to the operating mode. The multiple control circuits output, between the digital output signal and the second voltage, the one having a lower level as the second bias voltage, and output, between the digital output signal and the first voltage, the one having a higher level as the first bias voltage.

In some embodiments, the output circuit and the comparator circuit can detect the current operating mode according to a change in the supply voltage and enhance operation reliability during power-on of a system, and further add a mechanism of an isolated signal in a signal output circuit to reduce the influences of signal switching.

Features, implementations and effects of the present application are described in detail in preferred embodiments with the accompanying drawings below.

BRIEF DESCRIPTION OF THE DRAWINGS

To better describe the technical solution of the embodiments of the present application, drawings involved in the description of the embodiments are introduced below. It is apparent that, the drawings in the description below represent merely some embodiments of the present application, and other drawings apart from these drawings may also be obtained by a person skilled in the art without involving inventive skills.

DETAILED DESCRIPTION OF THE INVENTION

All terms used in the literature have commonly recognized meanings. Definitions of the terms in commonly used dictionaries and examples discussed in the disclosure of the present application are merely exemplary, and are not to be construed as limitations to the scope and meanings of the present application. Similarly, the present application is not limited to the embodiments enumerated in the description of the application.

The term "coupled" or "connected" used in the literature refers to two or multiple elements being directly and physically or electrically in contact with each other, or indirectly and physically or electrically in contact with each other, and may also refer to two or more elements operating or acting with each other. As given in the literature, the term "circuit" may be a device connected by at least one transistor and/or at least one active element by a predetermined means so as to process signals.

Figure 1:
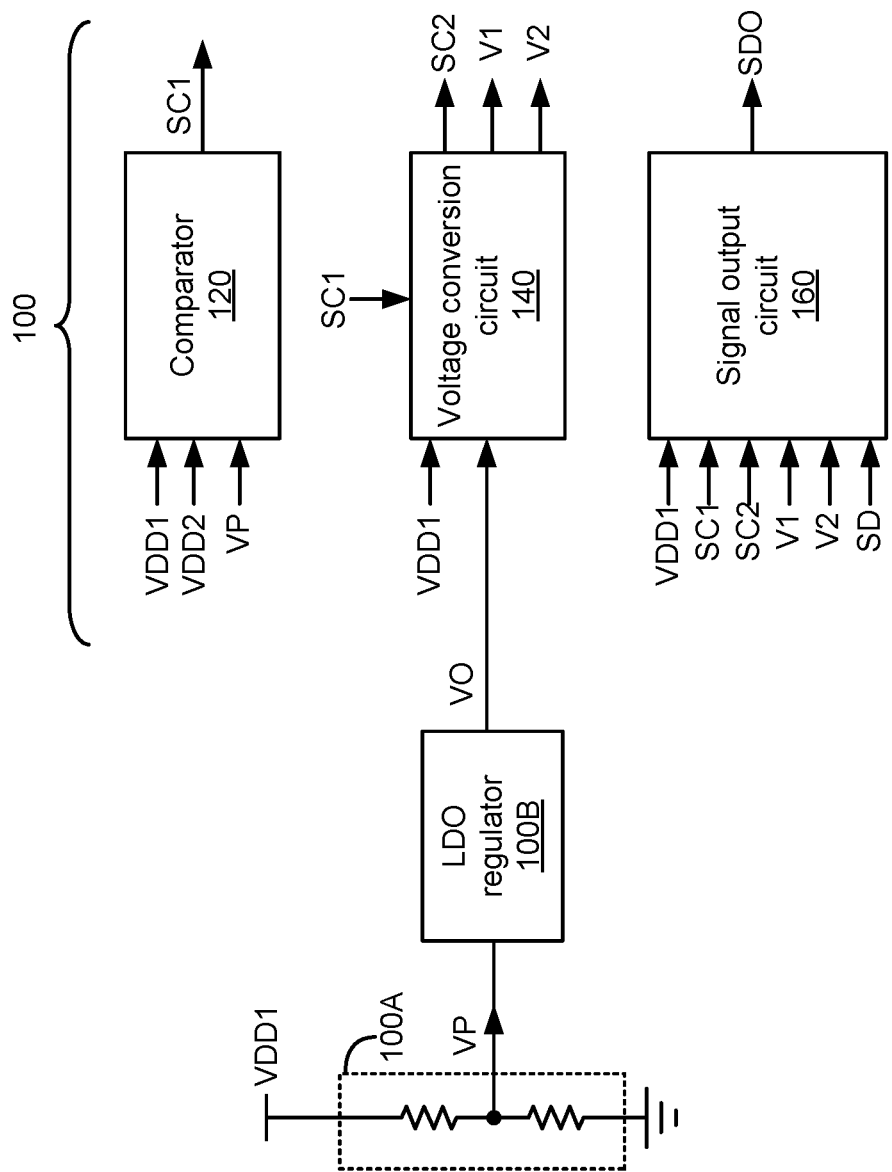
FIG. 1 is a schematic diagram of an output circuit according to some embodiments of the present application.

FIG. 1 is a schematic diagram of an output circuit 100 according to some embodiments of the present application. In some embodiments, the output circuit 100 is applicable to a general purpose input/output (GPIO) interface, so as to switch an operating mode according to different supply voltages and generate a digital signal having an appropriate level.

The output circuit 100 includes a comparator circuit 120, a voltage conversion circuit 140 and a signal output circuit 160. The comparator circuit 120 detects an operating mode of the output circuit 100 based on a supply voltage VDD1 and a supply voltage VDD2, and generates a control signal SC1. In some embodiments, in different operating modes, the level of the supply voltage VDD1 can be a first level (for example, 1.8 V) or a second level (for example, 3.3 V). The comparator circuit 120 can compare a predetermined voltage VP with the supply voltage VDD2 to generate the control signal SC1, wherein the predetermined voltage VP is a voltage generated by means of dividing the supply voltage VDD1 by a voltage dividing circuit 100A. For example, the predetermined voltage can be, for example but not limited to, a half of the supply voltage VDD1, that is, VP=0.5*VDD1.

The voltage conversion circuit 140 can adjust the level of an output voltage VO from a low-dropout (LDO) regulator 100B so as to generate a voltage V1, and generate a voltage V2 according to the control signal SC1 and the voltage V1. In some embodiments, the output voltage VO can be, for example but not limited to, a half of the supply voltage VDD1, that is, VO=0.5*VDD1. In some embodiments, the voltage conversion circuit 140 can generate a control signal SC2 according to the control signal SC1, wherein the control signal SC1 and the control signal SC2 are logically complementary, that is, the control signal SC2 is at logic 0 when the control signal SC1 is at logic 1, and vice versa. In some embodiments, the voltage dividing circuit 100A and the LDO regulator 100B can be integrated in the output circuit 100. In some embodiments, the voltage dividing circuit 100A and the LDO regulator 100B can be existing circuits in a system.

The signal output circuit 160 adjusts the level of a digital signal SD according to the voltage V1, the voltage V2 and the supply voltage VDD1 so as to generate a digital output signal SDO corresponding to a current operating mode. In some embodiments, the digital signal SD is a signal from other digital circuits in the system, and the digital output signal SDO is equivalent to a signal transmitted through the GPIO interface. In some embodiments, the signal output circuit 160 can further generate the digital output signal SDO according to multiple bias voltages, so as to reduce the interference imposed by switching of the digital output signal SDO on the voltage V1. Operation details related to the process above are described with reference to FIG. 4B below.

Figure 2A:
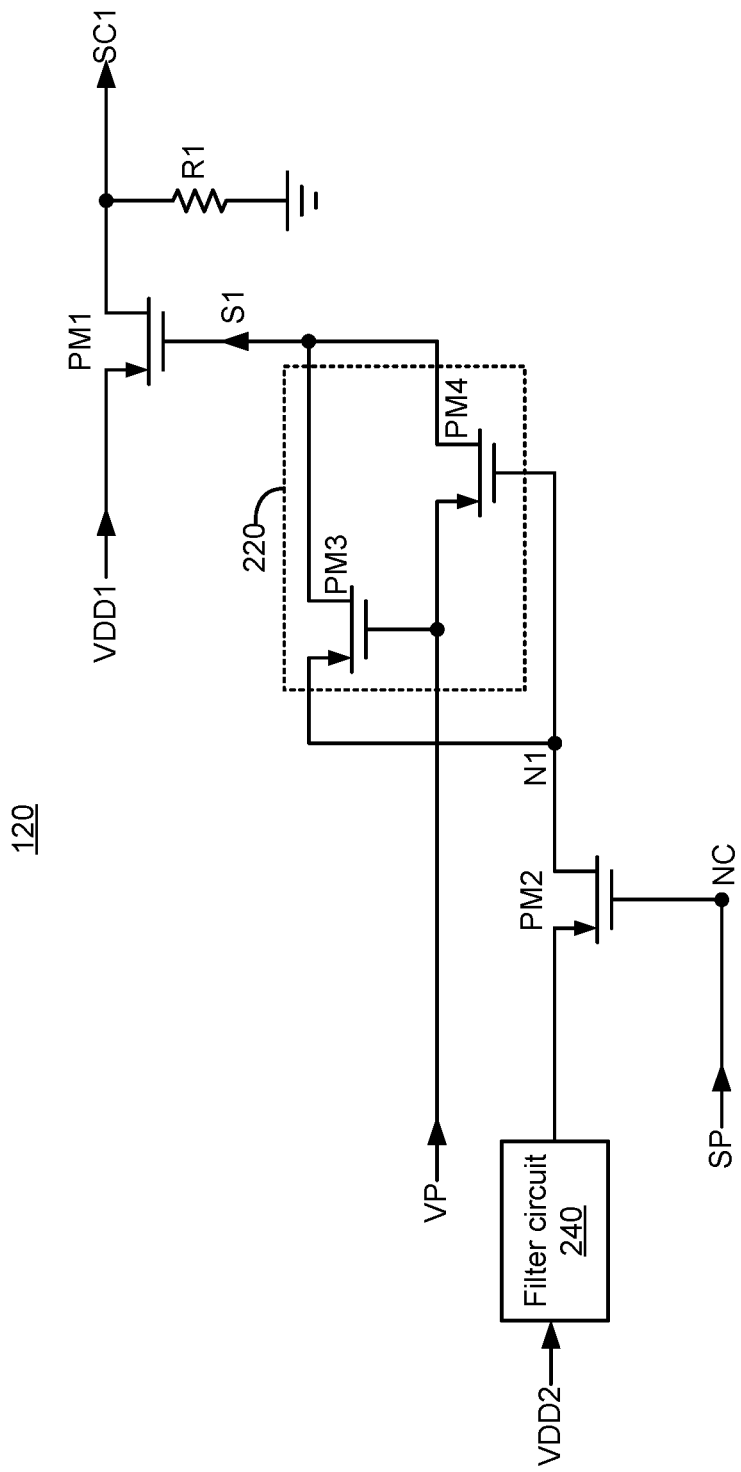
FIG. 2A is a schematic diagram of a comparator circuit in FIG. 1 according to some embodiments of the present application.

FIG. 2A shows a schematic diagram of a comparator circuit 120 in FIG. 1 according to some embodiments of the present application. The comparator circuit 120 includes a transistor PM1, a pull-down resistor R1, a comparator 220, a filter circuit 240 and a transistor PM2. The transistor PM1 is selectively turned on according to a signal S1 so as to output the supply voltage VDD1 as the control signal SC1. The pull-down resistor R1 is coupled between the transistor PM1 and the ground. Specifically, a first terminal (for example, the source) of the transistor PM1 receives the supply voltage VDD1, a second terminal (for example, the drain) of the transistor PM1 outputs the control signal SC1, and a control terminal (for example, the gate) of the transistor PM1 receives the signal S1. The pull-down resistor R1 is coupled between the second terminal of the transistor PM1 and the ground.

The comparator 220 compares a level of a node N1 with the predetermined voltage VP to generate the signal S1. In some embodiments, the comparator 220 includes a transistor PM3 and a transistor PM4. A first terminal of the transistor PM3 is coupled to the node N1, a second terminal of the transistor PM3 generates the signal S1, and a control terminal of the transistor PM3 receives the predetermined voltage VP. A first terminal of the transistor PM4 is coupled to the control terminal of the transistor PM3 and receives the predetermined voltage VP, a second terminal of the transistor PM4 is coupled to the second terminal of the transistor PM3, and a control terminal of the transistor PM4 is coupled to the node N1 and the first terminal of the transistor PM3. With the above configuration, the comparator 220 can output, between the level of the node N1 and the predetermined voltage VP, the one having a higher level as the signal S1. For example, if the level of the node N1 is higher than the predetermined voltage VP, the transistor PM3 is turned on and the transistor PM4 is turned off, so as to output the voltage on the node N1 as the signal S1. Alternatively, if the predetermined voltage VP is higher than the level of the node N1, the transistor PM3 is turned off and the transistor PM4 is turned on, so as to output the predetermined voltage VP as the signal S1.

The transistor PM2 receives the supply voltage VDD2 through the filter circuit 240, and is selectively turned on according to a level of a control node NC so as to transmit the received supply voltage VDD2 to the node N1. In other words, when the transistor PM2 is turned on, the level of the node N1 is equivalent to the supply voltage VDD2. In some embodiments, the filter circuit 240 can filter out noises on the supply voltage VDD2. Specifically, a first terminal of the transistor PM2 is coupled to the filter circuit 240, a second terminal of the transistor PM2 is coupled to the node N1, and a control node of the transistor PM2 is coupled to the control node NC. In some embodiments, a default state of the transistor PM2 is on (that is, the control node NC is at a low level when in a non-powered state).

In some embodiments, the comparator circuit 120 can determine the current operating mode according to the supply voltage VDD1 and the supply voltage VDD2. For example, the correspondence among the supply voltage VDD1, the supply voltage VDD2, the operating mode and the control signal SC1 can be expressed as the table below:

| Operating mode | VDD1 | VDD2 | SC1 |
|---|---|---|---|
| First mode | 1.8 V | 1.8 V | 0 V |
| Second mode | 3.3 V | 1.8 V | 3.3 V |

As shown in the above table, in the first mode, the supply voltage VDD1 and the supply voltage VDD2 are both set to 1.8 V. Because the transistor PM2 is defaulted as being on, the level of the node N1 is 1.8 V. In response to the level of the node N1, the transistor PM3 is turned on so as to output the voltage on the node N1 as the signal S1. Since the level of the signal S1 is close to the supply voltage VDD1 (for example, both 1.8 V), the transistor PM1 is off. Under the above condition, the pull-down resistor R1 pulls down the level of the second terminal of the transistor PM1 to the ground, so as to generate the control signal SC1 having a low level (that is, 0 V). Alternatively, in the second mode, the supply voltage VDD1 is set to 3.3 V and the supply voltage VDD2 is set to 1.8 V. Under the above condition, the transistor PM3 is turned on so as to output the voltage on the node N1 as the signal S1. Since the level of the signal S1 (for example, 1.8 V) is lower than the supply voltage VDD1, the transistor PM1 is turned on to hence output the control signal SC1 having a high level (that is, 3.3 V). In other words, the comparator circuit 120 can detect the current operating mode according to a change in the supply voltage VDD1, and accordingly output the control signal SC1 having a corresponding level.

In some applications, the comparator circuit 120 can operate according to a configuration signal SP output by a register circuit (not shown) in the system, so as to determine the current operating mode. For example, the configuration signal SP can first undergo level shifting and then be input to the control node NC. In general, the register circuit only starts to operate after a core circuit of the system is powered on, so as to output the control signal SP. In such application, the comparator circuit 120 can determine the current operating mode according to the change in the supply voltage VDD1 before the core circuit is powered on, without incurring any conflicts between the operation of the comparator circuit 120 and the configuration signal SP. In some embodiments, the correspondence among the configuration signal SP, the supply voltage VDD1, the supply voltage VDD2, the operating mode and the control signal SC1 can be expressed as the table below:

| Operating mode | VDD1 | VDD2 | SC1 | SP |
| --- | --- | --- | --- | --- |
| First mode | 1.8 V | 1.8 V | 0 V | Logic 1 |
| Second mode | 3.3 V | 1.8 V | 3.3 V | Logic 0 |
| Non-expected mode 1 | 1.8 V | 1.8 V | 1.8 V | Logic 0 |
| Non-expected mode 2 | 3.3 V | 1.8 V | 3.3 V | Logic 1 |

Because the transistor PM2 is defaulted as being on during power-on, the level of the node N1 is pulled up to the supply voltage VDD2 after the supply voltage VDD2 is turned on. Thus, after the transistor PM2 is turned off after receiving the configuration signal SP having logic 1 or after the transistor PM2 is kept on after receiving the configuration signal SP having logic 0, the operation of the comparator circuit 120 remains the same as before. Accordingly, it can be understood that the operation of the comparator circuit 120 does not conflict with the configuration signal of the current mode (that is, the configuration signal SP).

Moreover, in certain non-expected circumstances, the configuration signal SP may become erroneous; however, the comparator circuit 120 can nonetheless maintain reliability during power-on. For example, in the non-expected mode 1 in the above table, both the supply voltage VDD1 and the supply voltage VDD2 are set to 1.8 V, but the configuration signal SP is erroneously set to logic 0. In the above condition, the level of the control signal SC1 is 1.8 V. If the supply voltage VDD1 is corrected to 3.3 V (which correctly corresponds to the level of the configuration signal SP having logic 0) in the subsequent operation, the level of the control signal SC1 can restore to 3.3 V. Alternatively, in the non-expected mode 2 in the above table, the supply voltage VDD1 is set to 3.3 V and the supply voltage VDD2 is set to 1.8 V, but the configuration signal SP is erroneously set to logic 1. In the above condition, the level of the control signal SC1 is 3.3 V. If the supply voltage VDD1 is corrected to 1.8 V (which correctly corresponds to the level of the configuration signal SP having logic 1) in the subsequent operation, the level of the control signal SC1 can restore to 1.8 V.

In some related art, the operating mode of a circuit is switched by means of a configuration signal of the system, and certain restrictions are specified for the order of the configuration signal and power-on of a supply voltage during the switching. Compared to the above related art, the comparator circuit 120 can independently determine the operating mode by means of detecting the change in the supply voltage VDD1 and the supply voltage VDD2, and can operate according to a system-compatible control signal (that is, the configuration signal SP), wherein the configuration signal SP is not defined with any restrictions with respect to the change in the supply voltage VDD1 or the supply voltage VDD2. In some selective embodiments, the comparator circuit 120 can further include an inverter (not shown), which is powered by the supply voltage VDD2, and generates a control signal SC2 in FIG. 1 according to the control signal SC1.

Figure 2B:
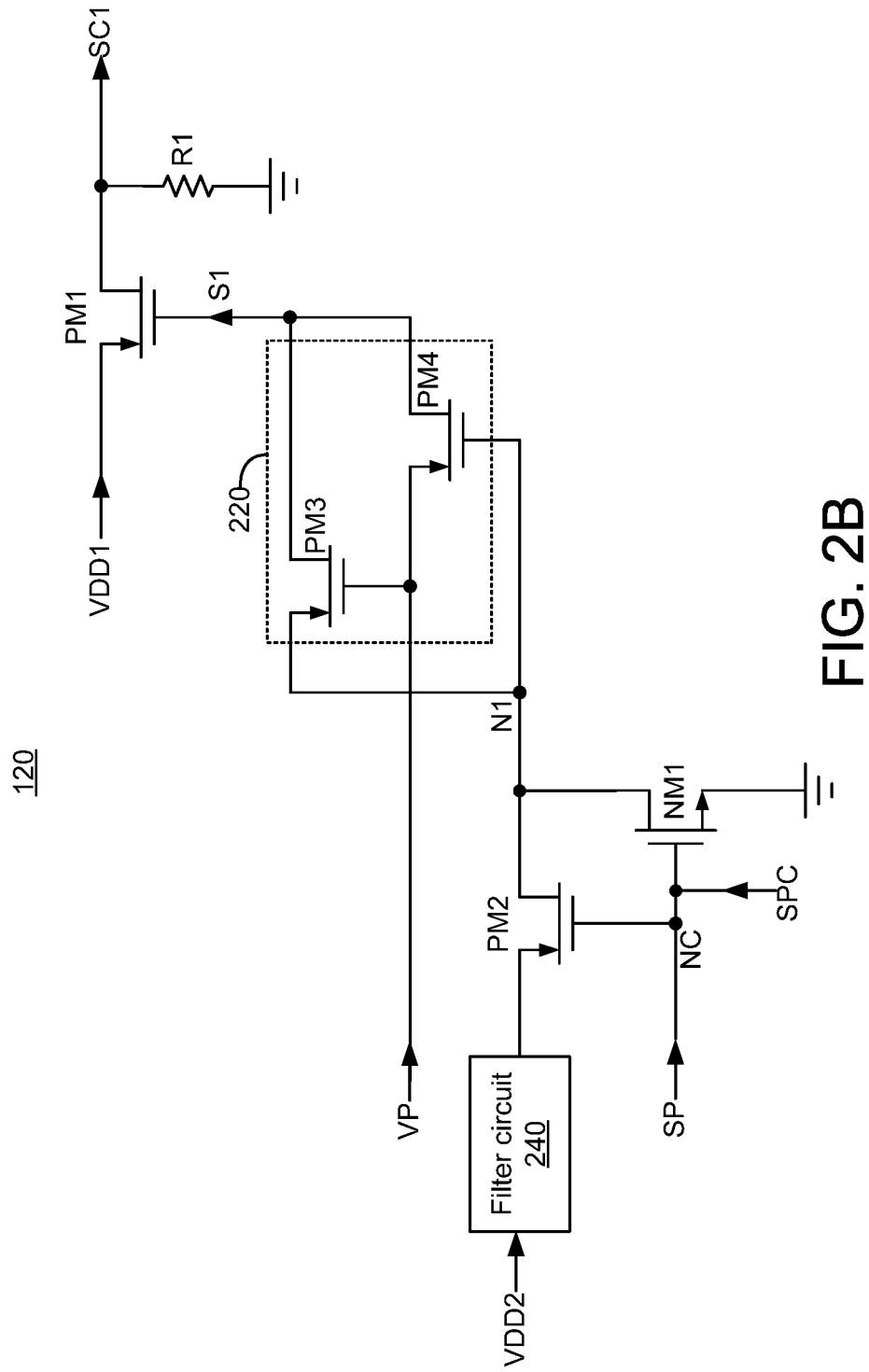
FIG. 2B is a schematic diagram of a comparator circuit in FIG. 1 according to some embodiments of the present application.

FIG. 2B shows a schematic diagram of a comparator circuit 120 in FIG. 1 according to some embodiments of the present application. Compared to the example in FIG. 2A, the comparator circuit 120 of this example further includes a transistor NM1. A first terminal (for example, the drain) of the transistor NM1 is coupled to the node N1, a second terminal (for example, the source) of the transistor NM1 is coupled to the ground, and a control terminal (for example, the gate) of the transistor NM1 is coupled to the control node NC and receives a power-on control signal SPC. The transistor NM1 can be selectively turned on according to the power-on control signal SCP so as to pull down the level of the node N1 to the ground. In some embodiments, the power-on control signal SPC can be a signal in the GPIO interface circuit that is used to indicate turning-on of the supply voltage VDD1 and the supply voltage VDD2.

The stability during power-on can be further enhanced with the transistor NM1 provided. For example, when the supply voltage VDD1 is instantaneously switched from the 0 V to 3.3 V (or 1.8 V), the power-on control signal SPC is at logic 1. Under the above condition, the transistor NM1 is turned on to pull down the level of the node N1 to the ground, and the transistor PM4 is turned on to output the predetermined voltage VP as the signal S1 so as to turn on the transistor PM1. As such, during the transient process of power-on, the level of the control signal SP1 can be kept the same as the supply voltage VDD1. Once the levels of the supply voltage VDD1 and the supply voltage VDD2 are stabilized, the power-on control signal SPC is released and is at logic 0. At this point, the comparator circuit 120 can determine the operating mode based on the supply voltage VDD1 and the supply voltage VDD2.

Figure 3:
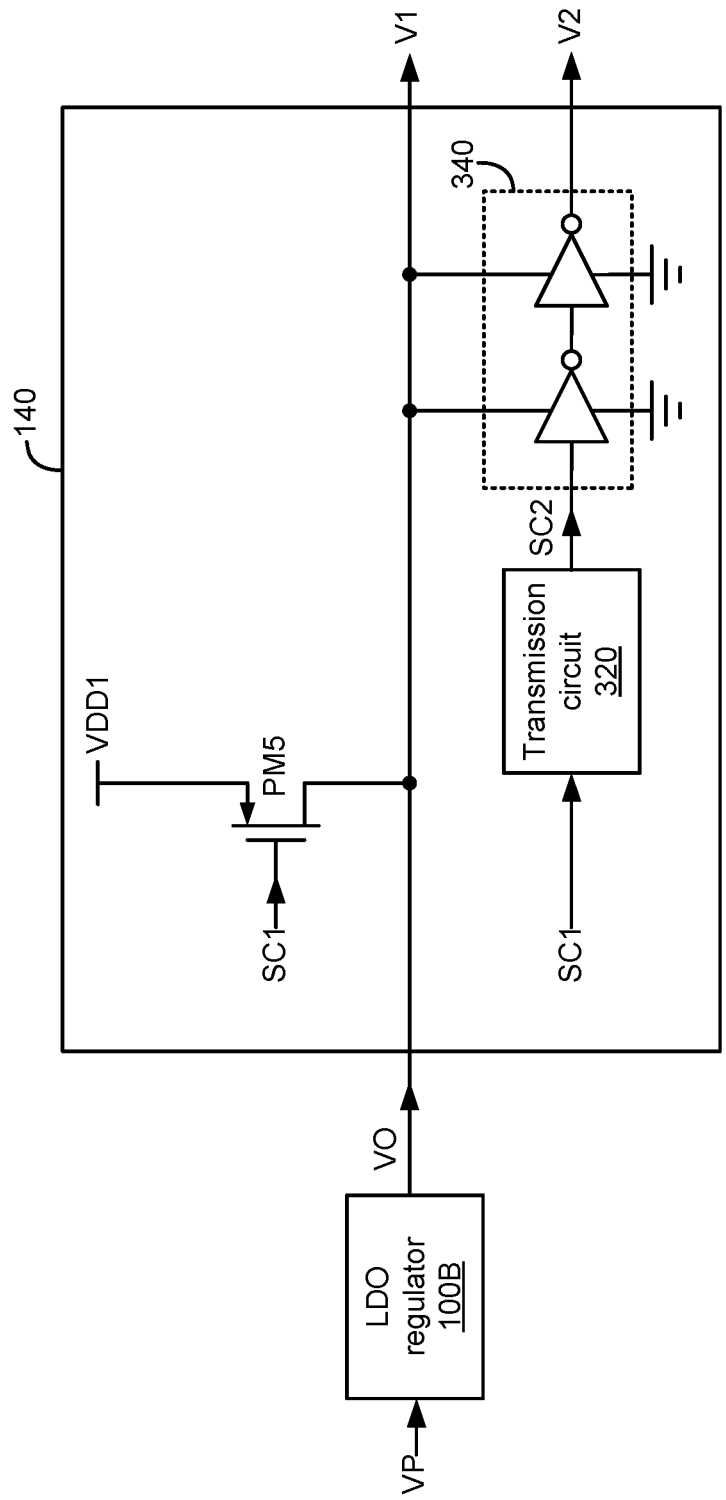
FIG. 3 is a schematic diagram of a voltage conversion circuit in FIG. 1 according to some embodiments of the present application.

FIG. 3 shows a schematic diagram of the voltage conversion circuit 140 in FIG. 1 according to some embodiments of the present application. The voltage conversion circuit 140 includes a transistor PM5, a transmission circuit 320 and a buffer circuit 340. A first terminal of the transistor PM5 receives the supply voltage VDD1, a second terminal of the transistor PM5 is coupled to an output terminal (for generating the output voltage VO) of the LDO regulator 1008, and a control terminal of the transistor PM5 receives the control signal SC1. The transistor PM5 is selectively turned on according to the control signal SC1 to pull up the level of the output voltage VO to the supply voltage VDD1 so as to generate the voltage V1. In some embodiments, the transistor PM5 has a larger size so as to have a greater pull-up ability. The transmission circuit 320 generates the control signal SC2 according to the control signal SC1. In some embodiments, the transmission circuit 320 can be implemented by a transmission gate and an inverter coupled in series. The buffer circuit 340 is powered by the voltage V1, and generates the voltage V2 according to the control signal SC2. For example, the buffer circuit 340 includes an even number of inverters, and these inverters are powered by the voltage V1 to generate the voltage V2 according to the control signal SC2.

In some embodiments, the first mode can be a bypass mode. In this mode, the transistor PM5 is turned on, such that the voltage V1 is kept the same as the supply voltage VDD1 (for example, 1.8 V), and the voltage V1 is equal to the voltage V2. In some embodiments, the second mode can be an LDO regulator mode. In this mode, the transistor PM5 is turned off, such that the voltage V1 is equal to the output voltage VO and different from the voltage V2 (for example, 0 V). Thus, the requirement for a multi-voltage level in the GPIO interface circuit can be met.

Figure 4A:
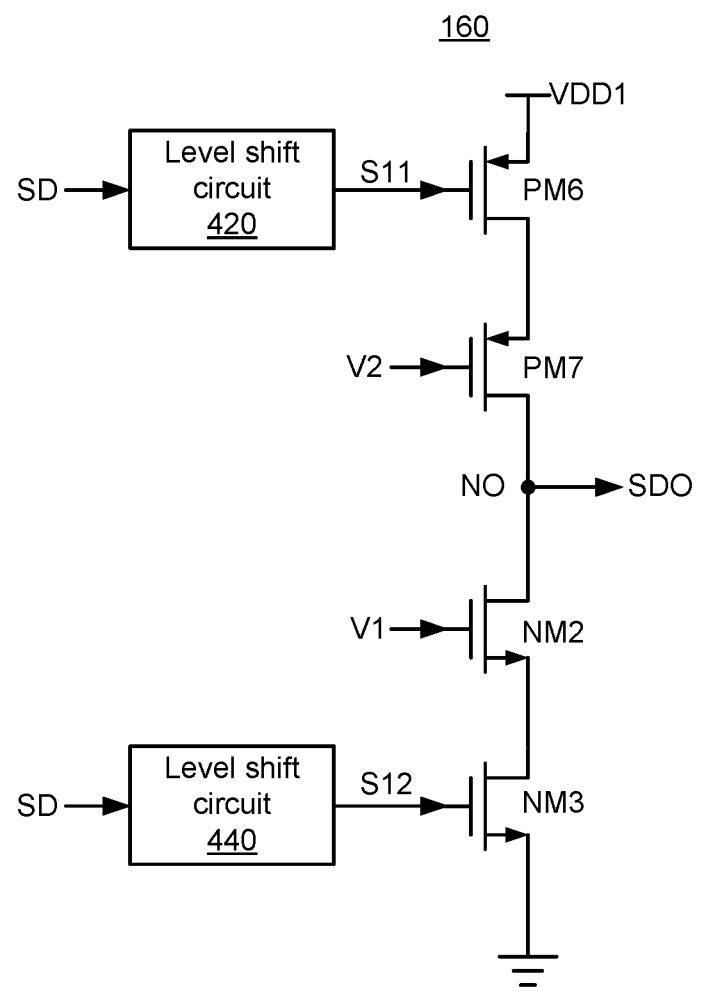
FIG. 4A is a schematic diagram of a signal output circuit in FIG. 1 according to some embodiments of the present application.

FIG. 4A shows a schematic diagram of the signal output circuit 160 in FIG. 1 according to some embodiments of the present application. The signal output circuit 160 includes a level shift circuit 420, a level shift circuit 440, multiple transistors PM6 and PM7, and multiple transistors NM2 and NM3. The level shift circuit 420 adjust the level of the digital signal SD to generate a signal S11. The level shift circuit 440 adjust the level of the digital signal SD to generate a signal S12. In some embodiments, the level shift circuit 420 and the level shift circuit 440 in the second mode can adjust the high level of the digital signal SD to 1.8 V, and in the second mode adjust the level from 1.8 V further to 3.3 V, so as to respectively generate the signal S11 and the signal S12. The transistor PM6 receives the supply voltage VDD1, and is selectively turned on according to the signal S11. The transistor PM7 is coupled between the output node NO and the transistor PM6, and is biased by the voltage V2 to output the digital output signal SDO through the output node NO. The transistor NM2 is coupled to the output terminal NO and is biased by the voltage V1. The transistor NM3 is coupled between the transistor NM2 and the ground, and is selectively turned on according to the signal S12.

Specifically, a first terminal of the transistor PM6 receives the supply voltage VDD1, a second terminal of the transistor PM6 is coupled to the first terminal of the transistor PM7, and a control terminal of the transistor PM6 is coupled to the level shift circuit 420 to receive the signal S11. A second terminal of the transistor PM7 is coupled to the output node NO and generates the digital output signal SDO, and a control terminal of the transistor PM7 receives the voltage V2. A first terminal of the transistor NM2 is coupled to the output node NO, a second terminal of the transistor NM2 is coupled to a first terminal of the transistor NM3, and a control terminal of the transistor NM2 receives the voltage V1. A second terminal of the transistor NM3 is coupled to the ground, and a control terminal of the transistor NM3 is coupled to the level shift circuit 440 to receive the signal S12. With the above configuration, the multiple transistors PM6, PM7, NM2 and NM3 and the multiple level shift circuits 420 and 440 can operate as a level adjustment circuit, which can adjust the level of the digital signal SD to a level corresponding to the current operating mode, and accordingly generate the digital output signal SDO.

Figure 4B:
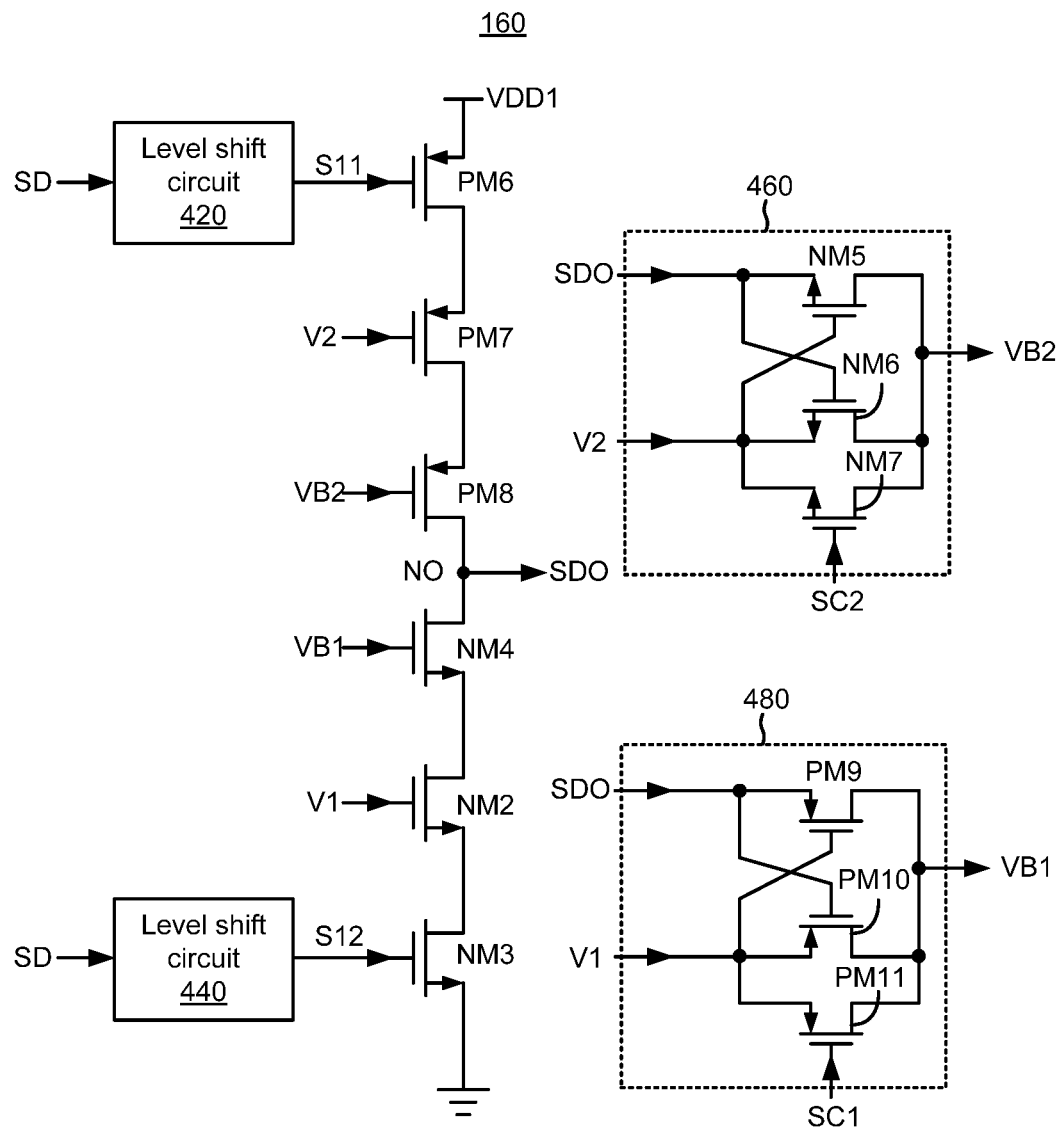
FIG. 4B is a schematic diagram of a signal output circuit in FIG. 1 according to some embodiments of the present application.

FIG. 4B shows a schematic diagram of the signal output circuit 160 in FIG. 1 according to some embodiments of the present application. Compared to the example in FIG. 4A, the signal output circuit 160 in this example further generates a bias voltage VB1 and a bias voltage VB2 according to the digital output signal SDO, and uses the bias voltage VB1 and the bias voltage VB2 to bias multiple transistors (for example, a transistor PM8 and a transistor NM4) directly connected to the output node NO, so as to reduce the influences of the digital output signal SDO on the LDO regulator 100B.

For example, compared to FIG. 4A, the signal output circuit 160 in FIG. 4B further includes a transistor PM8, a transistor NM4, a control circuit 460 and a control circuit 480. The transistor PM8 is coupled between the transistor PM7 and the output node NO, and is turned on according to the bias voltage VB2. The transistor NM4 is coupled between the output node NO and the transistor NM2, and is turned on according to the bias voltage VB1. Specifically, a first terminal of the transistor PM8 is coupled to a second terminal of the transistor PM7, a second terminal of the transistor PM8 is coupled to the output node NO, and a control node of the transistor PM8 receives the bias voltage VB2. A first terminal of the transistor NM4 is coupled to the output node NO, a second terminal of the transistor NM4 is coupled to the first terminal of the transistor NM2, and a control terminal of the transistor NM4 receives the bias voltage VB1.

The control circuit 460 outputs, between the digital output signal SDO and the voltage V2, the one having a lower level as the bias voltage VB2, and selectively adjusts the level of the bias voltage VB2 to the voltage V2 according to the control signal SC2. The control circuit 460 includes multiple transistors NM5 to NM7. The transistor NM5 and the transistor NM6 operate as a comparator (similar to the comparator 220 in FIG. 2A), which can compare the digital output signal SDO with the voltage V2, so as to output the one having a lower level between the two as the bias voltage VB2. The transistor NM7 is selectively turned on according to the control signal SC2 to output the voltage V2 as the bias voltage VB2. Similarly, the control circuit 480 outputs, between the digital output signal SDO and the voltage V1, the one having a higher level as the bias voltage VB1, and selectively adjusts the level of the bias voltage VB1 to the voltage V1 according to the control signal SC1. The control circuit 480 includes multiple transistors PM9 to PM11. The transistor PM9 and the transistor PM10 operate as a comparator (similar to the comparator 220 in FIG. 2A), which can compare the digital output signal SDO with the voltage V1, so as to output the one having a higher level between the two as the bias voltage VB1. The transistor PM11 is selectively turned on according to the control signal SC1 to output the voltage V1 as the bias voltage VB1. In this example, the multiple transistors PM6 to PM8 and NM2 to NM4 and the multiple level shift circuits 420 and 440 can operate as the foregoing level adjustment circuit to generate the digital output signal SDO.

In the example in FIG. 4A, the transistor PM7 and the transistor NM2 are directly connected to the output node NO. If the switching frequency of the digital output signal SDO is very high, the digital output signal SDO may become coupled through a parasitic capacitor to multiple control terminals of the transistor PM7 and the transistor NM2, further affecting the output voltage VO generated by the LDO regulator 100B. To improve the above issue, the transistor PM8 and the transistor NM3 can be further provided to isolate coupling of the digital output signal SDO, so as to better stabilize the output voltage VO. Moreover, in the first mode, the transistor PM11 is turned on to transmit the voltage V1 as the bias voltage VB1. In the second mode, the bias voltage VB1 is the one between the digital output signal SDO and the voltage V1 that has a lower level. Thus, the transistor PM8 can be more fully turned on. Similarly, in the first mode, the transistor NM7 is turned on to transmit the voltage V2 as the bias voltage VB2. In the second mode, the bias voltage VB2 is the one between the digital output signal SDO and the voltage V2 that has a higher level, so as to more fully turn on the transistor NM4.

In the above embodiments, the multiple transistors NM1 to NM7 are N-type transistors, and the multiple transistors PM1 to PM11 are P-type transistors. The transistors above can be implemented by metal oxide semiconductor field-effect transistors (MOSFET); however, the present application is not limited to the example above. Various types or conductive types capable of implementing similar operations are encompassed within the scope of the present application. Moreover, the numerical values of the voltages given in the embodiments are examples, and the voltages described in the present application are not limited to these exemplary numerical values.

In conclusion, the output circuit and the comparator circuit of some embodiments of the present application can detect the current operating mode according to a change in the supply voltage and enhance operation reliability during power-on of a system, and further add a mechanism of an isolated signal in a signal output circuit to reduce the influences of signal switching.

While the present application has been described by way of example and in terms of the preferred embodiments, it is to be understood that the present application is not limited thereto. Various modifications made be made to the technical features of the present application by a person skilled in the art on the basis of the explicit or implicitly disclosures of the present application. The scope of the appended claims of the present application therefore should be accorded with the broadest interpretation so as to encompass all such modifications.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded with the broadest interpretation so as to encompass all such modifications and similar arrangements and procedures.

What is claimed is:

1. An output circuit, comprising:
   a comparator circuit, detecting an operating mode based on a first supply voltage and a second supply voltage and generating a first control signal;
   a voltage conversion circuit, adjusting a level of an output voltage from a low-dropout regulator according to the first control signal to generate a first voltage, and generating a second voltage according to the first control signal and the first voltage; and
   a signal output circuit, adjusting a level of a digital signal according to the first voltage, the second voltage and the first supply voltage to generate a digital output signal corresponding to the operating mode.

2. The output circuit according to claim 1, wherein the comparator circuit comprises:
   a filter circuit;
   a second transistor, receiving the second supply voltage through the filter circuit, and selectively turned on according to a level of a control node so as to transmit the second supply voltage to a first node;
   a comparator, comparing a level of the first node with a predetermined voltage to generate a first signal, wherein the predetermined voltage is generated by dividing the first supply voltage;
   a first transistor, selectively turned on according to the first signal so as to output the first supply voltage as the first control signal; and
   a pull-down resistor, coupled between the first transistor and a ground.

3. The output circuit according to claim 2, wherein the comparator outputs, between a level of the first node and the predetermined voltage, the one having a higher level as the first signal.

4. The output circuit according to claim 2, wherein the comparator comprises:
   a third transistor, wherein a first terminal of the first transistor is coupled to the first node, a second terminal of the third transistor generates the first signal, and a control terminal of the third transistor receives the predetermined voltage; and
   a fourth transistor, wherein a first terminal of the fourth transistor receives the predetermined voltage, a second terminal of the fourth transistor is coupled to the second terminal of the third transistor, and a control terminal of the fourth transistor is coupled to the first node.

5. The output circuit according to claim 2, wherein the comparator circuit further comprises:
   a third transistor, selectively turned on according to a power-on control signal so as to pull down a level of the control node to the ground.

6. The output circuit according to claim 1, wherein the voltage conversion circuit comprises:
   a transistor, selectively turned on according to the first control signal to pull up a level of the output voltage to the first supply voltage so as to generate the first voltage;
   a transmission circuit, generating a second control signal according to the first control signal, wherein the second control signal and the first control signal are logically complementary; and
   a buffer circuit, powered by the first voltage, and generating the second voltage according to the second control signal.

7. The output circuit according to claim 1, wherein the signal output circuit comprises:
   a first level shift circuit, adjusting a level of the digital signal to generate a first signal;
   a second level shift circuit, adjusting the level of the digital signal to generate a second signal;
   a first transistor, receiving the first supply voltage, and selectively turned on according to the first signal;
   a second transistor, biased by the second voltage, wherein a first terminal of the second transistor is coupled to the first transistor, and a second terminal of the second transistor is coupled to an output node to output the digital output signal;
   a third transistor, biased by the first voltage, and coupled to the output node; and
   a fourth transistor, selectively turned on according to the second signal, wherein a first terminal of the fourth transistor is coupled to the third transistor, and a second terminal of the fourth transistor is coupled to a ground.

8. The output circuit according to claim 7, wherein the signal output circuit further comprises:

a fifth transistor, coupled between the second transistor and the output node, and turned on by a first bias voltage; and a sixth transistor, coupled between the output node and the third transistor, and turned on by a second bias voltage.

9. The output circuit according to claim 8, wherein the voltage conversion circuit further generates a second control signal according to the first control signal, and the signal output circuit further comprises:

a first control circuit, outputting, between the digital output signal and the second voltage, the one having a lower level as the first bias voltage, and selectively adjusting the level of the first bias voltage to the second voltage according to the second control signal; and a second control circuit, outputting, between the digital output signal and the first voltage, the one having a higher level as the second bias voltage, and selectively adjusting the level of the second bias voltage to the first voltage according to the first control signal.

10. The output circuit according to claim 9, wherein the first control circuit comprises:

a comparator, outputting, between the digital output signal and the second voltage, the one having the lower level as the first bias voltage; and a seventh transistor, selectively turned on according to the second control signal to transmit the second voltage as the first bias voltage.

11. The output circuit according to claim 1, wherein the signal output circuit outputs the digital output signal through an output node, and generates a first bias voltage and a second bias voltage according to the digital output signal, so as to bias, by the first bias voltage and the second bias voltage, a plurality of transistors directly connected to the output node in the signal output circuit.

12. A comparator circuit, detecting an operating mode according to a first supply voltage and a second supply voltage, the comparator circuit comprising:

a filter circuit;

a second transistor, receiving the second supply voltage through the filter circuit, and selectively turned on according to a level of a control node so as to transmit the second supply voltage to a first node;

a comparator, comparing a level of the first node with a predetermined voltage to generate a first signal, wherein the predetermined voltage is generated by dividing the first supply voltage;

a first transistor, selectively turned on according to the first signal so as to output the first supply voltage as a first control signal; and a pull-down resistor, coupled between the first transistor and a ground.

13. The comparator circuit according to claim 12, further comprising:

a third transistor, selectively turned on according to a power-on control signal so as to pull down a level of the control node to the ground.

14. An output circuit, comprising:

a voltage conversion circuit, adjusting a level of an output voltage from a low-dropout regulator according to a first control signal to generate a first voltage, and generates a second voltage according to the first control signal and the first voltage;

a level adjustment circuit, adjusting a level of a digital signal according to the first voltage, the second voltage, a first bias voltage, a second bias voltage and the first supply voltage so as to generate a digital output signal; and a plurality of control circuits, outputting, between the digital output signal and the second voltage, the one having a lower level as the second bias voltage, and outputting, between the digital output signal and the first voltage, the one having a higher level as the first bias voltage.

15. The output circuit according to claim 14, wherein the level adjustment circuit comprises:

a first level shift circuit, adjusting a level of the digital signal to generate a first signal;

a second level shift circuit, adjusting the level of the digital signal to generate a second signal;

a first transistor, receiving the first supply voltage, and selectively turned on according to the first signal;

a second transistor, biased by the second voltage, wherein a first terminal of the second transistor is coupled to the first transistor;

a third transistor, coupled between the second transistor and an output node, and turned on by the first bias voltage, wherein the output node outputs the digital output signal;

a fourth transistor, coupled between the output node and a fifth transistor, and turned on by the second bias voltage;

the fifth transistor, biased by the first voltage; and a sixth transistor, coupled between the fifth transistor and a ground, and selectively turned on according to the second signal.

* * * * *